(12) United States Patent
Zhang et al.

(10) Patent No.: US 9,252,760 B2
(45) Date of Patent: Feb. 2, 2016

(54) SIGNAL AMPLITUDE DETECTION CIRCUIT

(71) Applicant: IPGoal Microelectronics (Sichuan) Co., Ltd., Chengdu (CN)

(72) Inventors: Ziche Zhang, Chengdu (CN); Zhengxian Zou, Chengdu (CN)

(73) Assignee: IPGOAL MICROELECTRONICS (SICHUAN) CO., LTD., Chengdu, Sichuan (CN)

( * ) Notice: Subject to any disclaimer, the term of this patent is extended or adjusted under 35 U.S.C. 154(b) by 0 days.

(21) Appl. No.: 14/459,285

(22) Filed: Aug. 13, 2014

(65) Prior Publication Data
US 2015/0171851 A1 Jun. 18, 2015

(30) Foreign Application Priority Data
Dec. 18, 2013 (CN) .......................... 2013 1 0699896

(51) Int. Cl.
*H03D 1/00* (2006.01)
*H03K 5/00* (2006.01)
*H03K 5/24* (2006.01)

(52) U.S. Cl.
CPC ............ *H03K 5/2409* (2013.01); *H03K 5/2472* (2013.01)

(58) Field of Classification Search
CPC ........................... H03K 5/2409; H03K 5/2472
USPC ........................... 327/50, 79, 62, 58
See application file for complete search history.

(56) References Cited

U.S. PATENT DOCUMENTS

| 4,158,855 | A * | 6/1979 | Thomas | H04N 5/94 348/616 |
| 7,405,659 | B1 * | 7/2008 | Hyde | G06K 19/0723 340/10.4 |
| 9,083,357 | B2 * | 7/2015 | Zhang | H03L 7/0891 |

* cited by examiner

*Primary Examiner* — Dinh Le
(74) *Attorney, Agent, or Firm* — Shimokaji IP

(57) ABSTRACT

A signal amplitude detection circuit includes a detector and a trimming algorithm module, and the detector having a preset baseline threshold reference value and an output terminal connected with the trimming algorithm module which is arranged for recording and decoding an output result of the detector to output an amplitude code value, and generating a control signal for controlling the baseline threshold reference value rise to a power supply level from a ground level or drop to the ground level from the power supply level, and the output result of the detector being "1" if a crossover occurs between the baseline threshold reference value and the detected signal; otherwise being "0". The signal amplitude detection circuit detects the signal amplitude in a digital way, which has simpler structure, lower power consumption, reduced size of chips, and stable and accurate detection result without PVT drift.

8 Claims, 2 Drawing Sheets

SIGNAL AMPLITUDE DETECTION CIRCUIT

RELATED APPLICATIONS

This application claims the benefit of priority to Chinese Patent Application No. 201310699896.2, filed on Dec. 18, 2013, which is hereby incorporated by reference in its entirety.

FIELD OF THE INVENTION

The present invention relates to a technical field of semiconductor integrated circuits, more specifically to a signal amplitude detection circuit.

BACKGROUND OF THE INVENTION

Traditional signal amplitude detection circuit usually detects signal amplitudes by a way of using analog circuit filtering or analog signal amplitude-energy conversion, namely by a way of using analog circuits to realize the detection for the signal amplitude mainly. However, the detection result of the analog circuits may have an error due to some factors in technological process, and the bandwidth of analog filters and working point of the analog signal amplitude-energy conversion circuit cannot be determined accurately; moreover, no matter whether the analog filter or the analog signal amplitude-energy conversion circuit is used, it's necessary to add an extra A-D conversion circuit if the signal amplitude undergoes a detection by a following digital circuit, which brings a complicated structure for the whole signal amplitude detection circuit, thereby resulting in a difficult implementation.

Therefore, there is a need to provide an improved signal amplitude detection circuit to overcome above drawbacks.

SUMMARY OF THE INVENTION

An objective of the present invention is to provide a signal amplitude detection circuit to detect the signal amplitude in a digital way, which obtains a simpler structure, lower power consumption, compact size of chips and a stable detection result without PVT drift.

To achieve the objective, a signal amplitude detection circuit includes a detector and a trimming algorithm module, with a detected signal being inputted to the detector, the detector having a preset baseline threshold reference value and an output terminal connected with the trimming algorithm module which is arranged for recording and decoding an output result of the detector to output an amplitude code value, and generating a control signal arranged for controlling the baseline threshold reference value rise to a power supply level from a ground level or drop to the ground level from the power supply level, and the output result of the detector being "1" if a crossover occurs between the baseline threshold reference value and the detected signal; otherwise, being "0".

Preferably, the control signal is a binary digital signal with N bits, and N is a positive integer larger than or equal to 2, and the control signal is arranged for controlling the baseline threshold reference value rise to the power supply level from the ground level or drop to the ground level from the power supply level uniformly, with multiple changing levels of $2^N$.

Preferably, the detector comprises a first inverter, a second inverter, an AND gate, a first NOR gate and a second NOR gate, and the detected signal includes a positive detected signal which is inputted to an input terminal of the first inverter with the control signal and a negative detected signal which is inputted to an input terminal of the second inverter with the control signal, and an output terminal of the first inverter is connected with an input terminal of the first NOR gate and an input terminal of the AND gate respectively, an output terminal of the second inverter is connected with another input terminal of the first NOR gate and another input terminal of the AND gate respectively, and output terminals of both the first NOR gate and the AND gate are connected with an input terminal of the second NOR gate, and the output result of the detector is outputted by an output terminal of the second NOR gate.

Preferably, the detector further comprises a first capacitor and a second capacitor, and one terminal of the first capacitor is connected with the output terminal of the first NOR gate and an input terminal of the second NOR gate, and the other terminal of the first capacitor is grounded; one terminal of the second capacitor is connected with the output terminal of the AND gate and another input terminal of the second NOR gate, and the other terminal of the second capacitor is grounded.

Preferably, the first inverter and the second inverter have identical structure features.

Preferably, the first inverter comprises a first control switch group, a second control switch group, a current source group and a current sink group, and the detected signal is inputted to input terminals of the current source group and the current sink group, and output terminals of the current source group and the current sink group output a converted signal, the first control switch group is connected with the current source group to control its operation, and the second control switch group is connected with the current sink group to control its operation.

Preferably, the control signal is arranged for controlling turn-on or turn-off of the first control switch group and the second control switch group both of which include N control switches, and the current source group includes N current sources, the current sink group includes N current sinks, the N control switches of the first control switch group are connected with the N current sources of the current source group respectively, and the N control switches of the second control switch group are connected with the N current sinks of the current sink group respectively.

Preferably, the N current sources and the N current sinks are Field Effect Transistors or Bipolar Junction Transistors.

In comparison with the prior art, the signal amplitude detection circuit of the present invention makes the detected signal have a crossover with the baseline threshold reference value within its level amplitude range by controlling the baseline threshold reference value rise to a power supply level from a ground level or drop to the ground level from the power supply level, and the output result of the detector is "1" when the above crossover occurs, otherwise the output result of the detector is "0". In such a way, an amplitude value of the detected signal can be obtained. Moreover, since the present invention detects the signal amplitude in a digital way, so the structure is simple, the power consumption is low, the size of chips is reduced, and the detection result is stable and accurate without PVT drift.

The present invention will become more apparent from the following detailed descriptions when taken in conjunction with the accompanying drawings that used to illustrate embodiments of the present invention.

DETAILED DESCRIPTION OF ILLUSTRATED EMBODIMENTS

Figure 1:
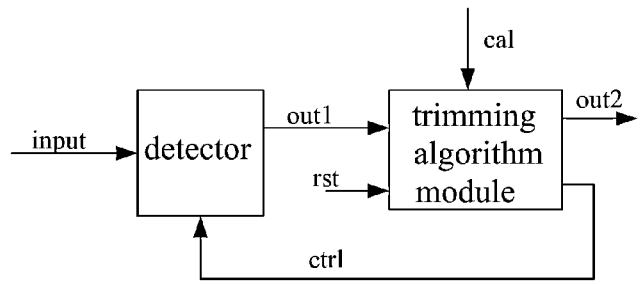
FIG. 1 is a frame diagram of the signal amplitude detection circuit according to the present invention.

Preferred embodiments of the present invention will be described taking in conjunction with the accompanying drawings below, and a similar component label in the drawings refers to a similar component. As noted above, the present invention provides a signal amplitude detection circuit to detect the signal amplitude in a digital way, so that the structure is simple, the power consumption is low, the size of chips is reduced, and the detection result is stable and accurate without PVT (process-voltage-temperature) drift.

Figure 2:
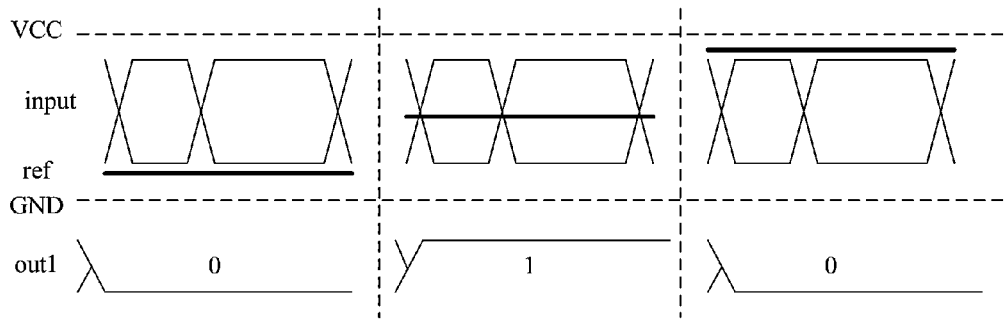
FIG. 2 is an oscillogram of the signal amplitude detection circuit under working state.
Figure 3:
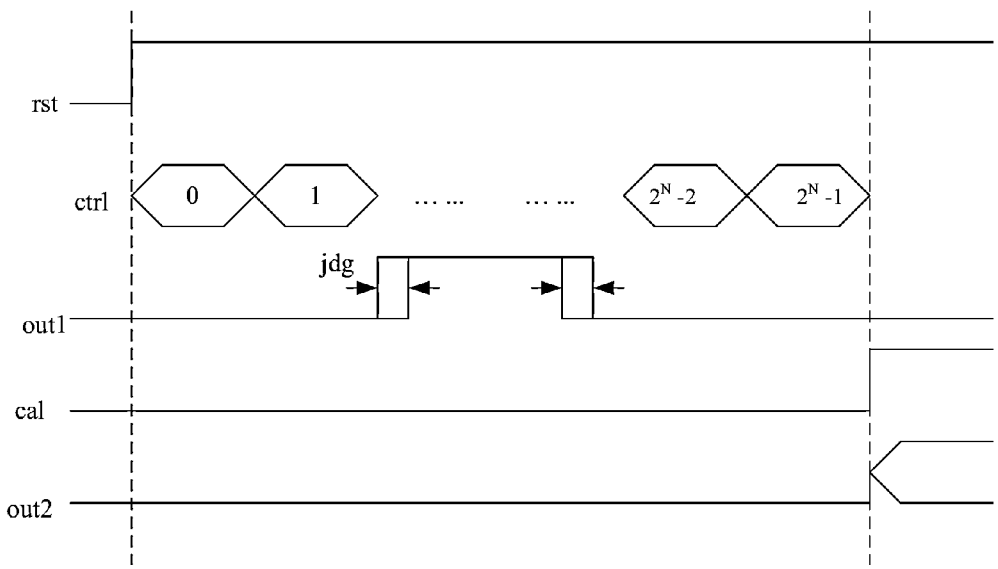
FIG. 3 is a time sequence diagram of the signal amplitude detection circuit under working state.

Please refer to FIG. 1~FIG. 3, the signal amplitude detection circuit of the present invention includes a detector and a trimming algorithm module, and the detector has a preset baseline threshold reference value ref (as shown in FIG. 2). A detected signal input is inputted to the detector, and an output terminal of the detector is connected with the trimming algorithm module which is arranged for recording and decoding an output result out1 of the detector to output an amplitude code value out2, and generating a control signal ctrl. Concretely, the control signal ctrl is a binary digital signal with N bits, and N is a positive integer larger than or equal to 2, and the control signal ctrl is arranged for controlling the baseline threshold reference value ref rise to a power supply level VCC (as shown in FIG. 2) from a ground level GND or drop to the ground level GND (not shown) from the power supply level VCC uniformly, with multiple changing levels of $2^N$. If a crossover occurs between the baseline threshold reference value ref and the detected signal input, the output result of the detector is "1"; otherwise, the output result of the detector is "0" (as shown in FIG. 3). Therefore, an amplitude value of the detected signal input (namely the amplitude code value out2) can be obtained effectively by measuring a length of the output result out1 of "1" and undergoing a conversion by the trimming algorithm module. Furthermore, in the present invention, since the amount of the changing levels between the power supply level VCC and the ground level GND is $2^N$, so if the value of N is the larger, the changing levels of the baseline threshold reference value ref rising or dropping are the more, that is, the crossovers between the baseline threshold reference value ref and the detected signal input are the more, which improves the accuracy of the output result out1 of the detector. Therefore, the value of N can be set according to a need for accuracy, and the accuracy of the output result will be higher if the value of N is larger.

Figure 4:
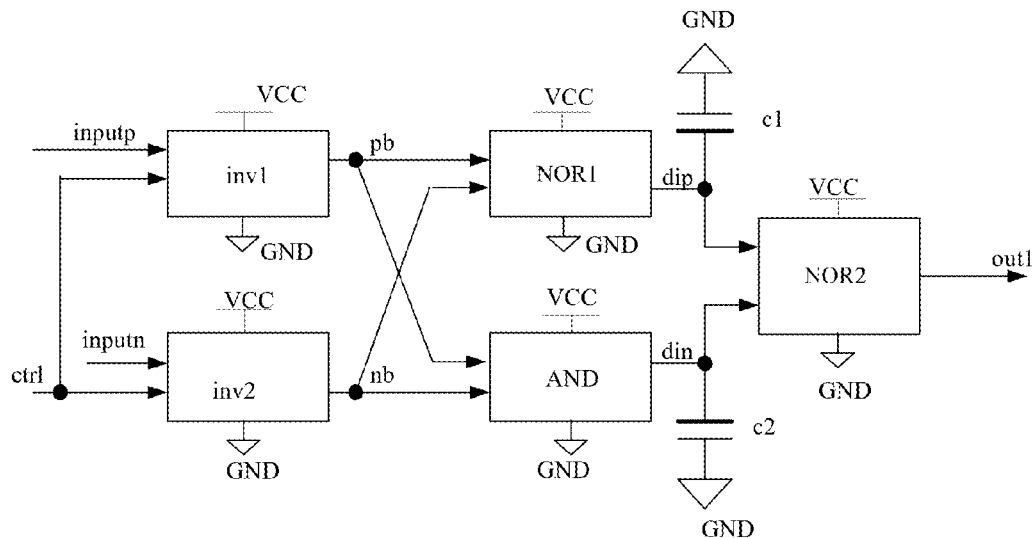
FIG. 4 is a circuit diagram of the detector according to the signal amplitude detection circuit of the present invention.
Figure 5:
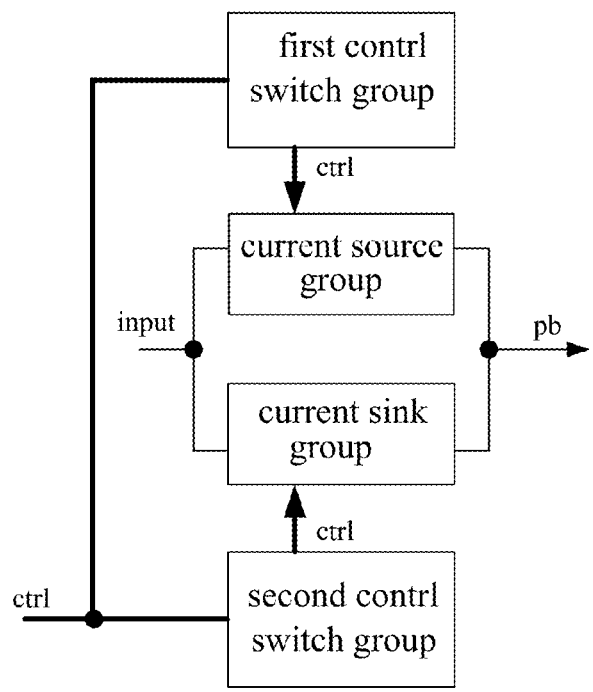
FIG. 5 is a frame diagram of the first inverter according to FIG. 4.

Concretely, please refer to FIG. 4 by combination with FIG. 5, the detector includes a first inverter inv1, a second inverter inv2, an AND gate AND, a first NOR gate NOR1 and a second NOR gate NOR2. The detected signal input is differential signals including a positive detected signal inputp and a negative detected signal inputn, and the positive detected signal inputp and the control signal ctrl are inputted to an input terminal of the first inverter inv1, the negative detected signal inputn and the control signal ctrl are inputted to an input terminal of the second inverter inv2, thereby the control signal ctrl can control the positive detected signal inputp invert in the first inverter inv1 to output a signal pb, and control the negative detected signal inputn invert in the second inverter inv2 to output a signal nb. An output terminal of the first inverter inv1 is connected with an input terminal of the first NOR gate NOR1 and an input terminal of the AND gate AND respectively, an output terminal of the second inverter inv2 is connected with another input terminal of the first NOR gate NOR1 and another input terminal of the AND gate AND respectively, and output terminals of both the first NOR gate NOR1 and the AND gate AND are connected with an input terminal of the second NOR gate NOR2, and the output result out1 of the detector is outputted from an output terminal of the second NOR gate NOR2. Furthermore, in preferred embodiments of the present invention, the detector further includes a first capacitor c1 and a second capacitor c2, and one terminal of the first capacitor c1 is connected with the output terminal of the first NOR gate NOR1 and an input terminal of the second NOR gate NOR2, and the other terminal of the first capacitor c1 is grounded; and one terminal of the second capacitor c2 is connected with the output terminal of the AND gate AND and another input terminal of the second NOR gate NOR2, and the other terminal of the second capacitor c2 is grounded; thereby noises of the signal dip outputted from the first NOR gate NOR1 and the signal din outputted from the AND gate AND can be eliminated by the first capacitor c1 and the second capacitor c2, making the whole circuit work more stable.

In addition, in preferred embodiments of the present invention, the first inverter inv1 and the second inverter inv2 have identical structure features, so only the structure features of the first inverter inv1 are introduced here. As shown in FIG. 5, the first inverter inv1 includes a first control switch group, a second control switch group, a current source group and a current sink group; and the positive detected signal inputp is inputted to input terminals of the current source group and the current sink group, and output terminals of the current source group and the current sink group output a converted signal pb; the first control switch group is connected with the current source group to control its operation, the second control switch group is connected with the current sink group to control its operation. Concretely, the first control switch group and the second control switch group both include N control switches, and one control terminal of each control switch is controlled by binary digits corresponding to the control signal ctrl. Specifically, the current source group includes N current sources which are connected in parallel with each other and connected with the N control switches of the first control switch group respectively and accordingly, and the current sink group includes N current sinks which are connected in parallel with each other and connected with the N control switches of the second control switch group respectively and accordingly. Besides, turn-on or turn-off of the first control switch group and the second control switch group (as shown in FIG. 5) are controlled by the control signal whose control words of the control signal correspondingly control the switches of the first control switch group and the second control switch group one by one, so as to control their turn-on of turn-off. In addition, in preferred embodiments of the present invention, the N current sources and the N current sinks may be Field Effect Transistors (FET) or Bipolar Junction Transistors (BJT), of course may be other components or circuits serving as current sinks or current sources.

Working principle of the signal amplitude detection circuit according to the present invention will be described by combination with figures from FIG. 1 to FIG. 5 as following.

When a control terminal rst of the trimming algorithm module is set to 1, the whole signal amplitude detection circuit starts to operate. Subsequently, the control signal ctrl controls the baseline threshold reference value ref rise to the power supply level VCC from the ground level GND uniformly with multiple changing levels of 2 (of course, the baseline threshold reference value ref may drop to the ground level GND from the power supply level VCC by changing the control way of the control signal ctrl), till then a level scan from the ground level to the power supply level or from the power supply level to the ground level is accomplished. During the scanning process, the trimming algorithm module detects and records the status of the output result out1 of the detector, and the output result out1 of the detector will be "1" if a crossover occurs between the detected signal input and the baseline threshold reference value ref, otherwise, the output result out1 of the detector will be "0" if no crossover occurs between the detected signal input and the baseline threshold reference value ref. Finally, when the scanning process is finished, the trimming algorithm module decodes all status information of the output result out1 of the detector to obtain the amplitude code value out2, and sets another control terminal cal of the trimming algorithm module to 1 at the same time to indicate the detection process is finished.

Concretely, if the level of the detected signal input which includes the positive detected signal inputp and the negative detected signal inputn is higher than the baseline threshold reference value ref, as shown in left part of the FIG. 2, then the first inverter inv1 outputs the signal pb after the positive detected signal inputp is inputted, and the second inverter inv2 outputs the signal nb after the negative detected signal inputn is inputted, and the values of both the signal pb and the signal nb are "0". After that, the signal pb and the signal nb are inputted to the first NOR gate NOR1, as a result, the first NOR gate NOR1 outputs the signal dip whose value is "1", at the same time, the signal pb and the signal nb are inputted to the AND gate AND, and the AND gate AND outputs the signal din whose value is "0"; finally, the signal dip and the signal din are inputted to the second NOR gate NOR2, to output the output result out1 of "0" that means no crossover occurs between the detected signal input and the baseline threshold reference value ref. While if the level of the detected signal input is lower than the baseline threshold reference value ref, as shown in right part of the FIG. 2, then the first inverter inv1 outputs the signal pb after the positive detected signal inputp is inputted, and the second inverter inv2 outputs the signal nb after the negative detected signal inputn is inputted, and the values of the signal pb and the signal nb are "1"; and then the signal pb and the signal nb are inputted to the first NOR gate NOR1, as a result, the first NOR gate NOR1 outputs the signal dip whose value is "0", at the same time, the signal pb and the signal nb are inputted to the AND gate AND, and the AND gate AND outputs the signal din whose value is "1"; finally, the signal dip and the signal din are inputted to the second NOR gate NOR2, to output the output result out1 of "0" that means no crossover occurs between the detected signal input and the baseline threshold reference value ref. Otherwise, if the level of the detected signal input is equal to the baseline threshold reference value ref, as shown in middle part of the FIG. 2, then the first inverter inv1 outputs the signal pb after inputting the positive detected signal inputp, and the second inverter inv2 outputs the signal nb after inputting the negative detected signal inputn, and the value of the signal pb is "0", the value of the signal nb is "1"; and then the signal pb and signal nb are inputted to the first NOR gate NOR1, as a result, the first NOR gate NOR1 outputs the signal dip whose value is "0", at the same time, the signal pb and the signal nb are inputted to the AND gate AND, and the AND gate AND outputs the signal din whose value is "0"; finally, the signal dip and the signal din are inputted to the second NOR gate NOR2, to output the output result out1 of "1" that means crossovers occur between the detected signal input and the baseline threshold reference value ref. That is, the output result out1 of the detector is "1" only if a crossover occurs between the detected signal input and the baseline threshold reference value ref, and the baseline threshold reference value ref is risen from the ground level GND to the power supply level VCC, thus every level value of the detected signal input has a crossover with the baseline threshold reference value ref (obviously, the greater the value of N is, the more the crossovers are). In such a way, the signal amplitude of the detected signal input is reflected by the status of the output result out1 of "1", and then the output result out1 will be converted into the output result out2 which is the signal amplitude of the detected signal.

In addition, the process of the inverters dealing with the detected signal input are illustrated as following, and since the first inverter inv1 and the second inverter inv2 have identical structure features, so only the structure features of the first inverter inv1 are described. Concretely, if the first control switch group controls N−1 current sources of the current source group in parallel to turn on, and the second control switch group controls only one current sink of the current sink group in parallel to turn on at the same time, in this condition, the effect of the current source group is largely greater than the current sink group, that is, the current source predominates to invert the output signal pb (namely inverted relative to the detected signal input) due to the lower turn-on threshold of the current source (namely the amplitude of the detected signal input is higher). Otherwise, if the first control switch group controls only one current source of the current source group in parallel to turn on, and the second control switch group controls N−1 current sinks of the current sink group in parallel to turn on at the same time, then the effect of the current sink group is largely greater than the current source group, that is, the current sink predominates to invert the output signal pb due to the lower turn-on threshold of the current sink (namely the amplitude of the detected signal input is lower). Regarding the normal state of the above two cases, if the first control switch group controls N-M (M is a positive integer smaller than N) current sources of the current source group in parallel to turn on, and the second control switch group controls M current sinks of the current sink group in parallel to turn on at the same time, then inverting points of the output signal pb are controlled by the current source group and the current sink group according to their own weight. Concretely, if an amount of the current source connected to the current source group is larger than an amount of the current sink connected to the current sink group, then the current source will predominate to invert the output signal pb due to due to the lower turn-on threshold of the current source (namely the amplitude of the detected signal input is higher); otherwise, if the amount of the current sinks connected to the current sink group is larger than the amount of the current sources connected to the current source group, then the current sink will predominate to invert the output signal pb due to the lower turn-on threshold of the current sink (namely the amplitude of the detected signal input is lower). That is, the inverting threshold of the output signal pb is depended on the weight of the current source group and the current sink group connected. Besides, "jdg" showed in FIG. 3 shows a determining deviation of the detected signal input detected by the detector, that's because the detected signal input is an analog signal, as well known, noise jitters are usually generated to result in a determining deviation when the output result out1 jumps at the crossover point, While the present invention has been described in connection with what are presently considered to be the most practical and preferred embodiments, it is to be understood that the invention is not to be limited to the disclosed embodiments, but on the contrary, is intended to cover various modifications and equivalent arrangements included within the spirit and scope of the invention.

What is claimed is:

1. A signal amplitude detection circuit, comprising a detector and a trimming algorithm module, with a detected signal being inputted to the detector, the detector having a preset baseline threshold reference value and an output terminal connected with the trimming algorithm module which is arranged for recording and decoding an output result of the detector to output an amplitude code value, and generating a control signal which is connected to the detector to control the baseline threshold reference value rise to a power supply voltage from zero or drop to zero from the power supply voltage, and the output result of the detector being "1" if a crossover occurs between the baseline threshold reference value and the detected signal; otherwise, being "0".

2. The signal amplitude detection circuit according to claim 1, wherein the control signal is a binary digital signal with N bits, and N is a positive integer larger than or equal to 2, and the control signal is arranged for controlling the baseline threshold reference value rise to the power supply level from the ground level or drop to the ground level from the power supply level uniformly, with multiple changing levels of $2^N$.

3. The signal amplitude detection circuit according to claim 2, wherein the detector comprises a first inverter, a second inverter, an AND gate, a first NOR gate and a second NOR gate, and the detected signal includes a positive detected signal which is inputted to an input terminal of the first inverter with the control signal and a negative detected signal which is inputted to an input terminal of the second inverter with the control signal, and an output terminal of the first inverter is connected with an input terminal of the first NOR gate and an input terminal of the AND gate respectively, an output terminal of the second inverter is connected with another input terminal of the first NOR gate and another input terminal of the AND gate respectively, and output terminals of both the first NOR gate and the AND gate are connected with an input terminal of the second NOR gate, and the output result of the detector is outputted by an output terminal of the second NOR gate.

4. The signal amplitude detection circuit according to claim 3, wherein the detector further comprises a first capacitor and a second capacitor, and one terminal of the first capacitor is connected with the output terminal of the first NOR gate and an input terminal of the second NOR gate, and the other terminal of the first capacitor is grounded; one terminal of the second capacitor is connected with the output terminal of the AND gate and another input terminal of the second NOR gate, and the other terminal of the second capacitor is grounded.

5. The signal amplitude detection circuit according to claim 4, wherein the first inverter and the second inverter have identical structure features.

6. The signal amplitude detection circuit according to claim 5, wherein the first inverter comprises a first control switch series, a second control switch series, a current source series and a current sink series, and the detected signal is inputted to input terminals of the current source series and the current sink series, and output terminals of the current source series and the current sink series output a converted signal, the first control switch series is connected with the current source series to control its operation, and the second control switch series is connected with the current sink series to control its operation.

7. The signal amplitude detection circuit according to claim 6, wherein the control signal is arranged for controlling turn-on or turn-off of the first control switch series and the second control switch series both of which include N control switches, and the current source series includes N current sources, the current sink series includes N current sinks, the N control switches of the first control switch series are connected with the N current sources of the current source series respectively, and the N control switches of the second control switch series are connected with the N current sinks of the current sink series respectively.

8. The signal amplitude detection circuit according to claim 7, wherein the N current sources and the N current sinks are Field Effect Transistors or Bipolar Junction Transistors.

* * * * *